(12) United States Patent
Vihriälä et al.

(10) Patent No.: US 11,309,920 B2
(45) Date of Patent: Apr. 19, 2022

(54) RECIPIENT IDENTIFICATION FOR FIFTH GENERATION COMMUNICATION

(71) Applicant: Nokia Technologies Oy, Espoo (FI)

(72) Inventors: Jaakko Eino Ilmari Vihriälä, Oulu (FI); Keeth Saliya Jayasinghe, Piliyandala (LK)

(73) Assignee: NOKIA TECHNOLOGIES OY, Espoo (FI)

( * ) Notice: Subject to any disclaimer, the term of this patent is extended or adjusted under 35 U.S.C. 154(b) by 201 days.

(21) Appl. No.: 16/461,064

(22) PCT Filed: Oct. 31, 2017

(86) PCT No.: PCT/FI2017/050752
§ 371 (c)(1),
(2) Date: May 15, 2019

(87) PCT Pub. No.: WO2018/100231
PCT Pub. Date: Jun. 7, 2018

(65) Prior Publication Data
US 2019/0273517 A1    Sep. 5, 2019

Related U.S. Application Data

(60) Provisional application No. 62/429,219, filed on Dec. 2, 2016.

(51) Int. Cl.
*H03M 13/00* (2006.01)
*H04W 76/11* (2018.01)
(Continued)

(52) U.S. Cl.
CPC ......... *H03M 13/618* (2013.01); *H03M 13/09* (2013.01); *H03M 13/1194* (2013.01);
(Continued)

(58) Field of Classification Search
CPC .......... H03M 13/618; H03M 13/2906; H03M 13/09; H03M 13/1194; H03M 13/13;
(Continued)

(56) References Cited

U.S. PATENT DOCUMENTS 7,177,658 B2 *   2/2007   Willenegger ......... H04L 1/0083
                                                 455/522
8,489,128 B2 *   7/2013   Lundby .................. H04L 1/0038
                                                 455/466
(Continued)

FOREIGN PATENT DOCUMENTS

CN    101034935 A    9/2007
CN    103701564 A    4/2014
(Continued)

OTHER PUBLICATIONS

Beermann et al., "Rate-Compatible LDPC Codes Using Optimized Dummy Bit Insertion", International Symposium on Wireless Communication Systems, Nov. 6-9, 2011, 5 pages.
(Continued)

*Primary Examiner* — Albert Decady
*Assistant Examiner* — Enamul M Kabir
(74) *Attorney, Agent, or Firm* — Squire Patton Boggs (US) LLP

(57) ABSTRACT

Identification of communication participants may be an important aspect of various communication systems. For example, fifth generation (5G) wireless communication systems may benefit from suitable recipient identification. A method can include obtaining data bits to be communicated to a target device. The method can also include obtaining identification bits corresponding to at least one of sender or receiver of the data bits. The method can further include multiplexing the data bits with the identification bits.

18 Claims, 3 Drawing Sheets

(51) Int. Cl.
*H03M 13/09* (2006.01)
*H03M 13/11* (2006.01)
*H03M 13/13* (2006.01)
*H03M 13/29* (2006.01)
*H04L 1/00* (2006.01)
*H04W 28/06* (2009.01)
*H04W 72/04* (2009.01)

(52) U.S. Cl.
CPC ....... *H03M 13/13* (2013.01); *H03M 13/2906* (2013.01); *H03M 13/2957* (2013.01); *H03M 13/6362* (2013.01); *H04L 1/004* (2013.01); *H04L 1/0013* (2013.01); *H04L 1/0041* (2013.01); *H04W 28/06* (2013.01); *H04W 72/042* (2013.01); *H04W 76/11* (2018.02)

(58) Field of Classification Search
CPC .......... H03M 13/2957; H03M 13/6362; H04L 1/004; H04L 1/0041; H04L 1/0013; H04W 76/11; H04W 28/06; H04W 72/042
See application file for complete search history.

(56) References Cited

U.S. PATENT DOCUMENTS

| | | | | |
|---|---|---|---|---|
| 8,902,802 B2 * | 12/2014 | Park | ................. | H04W 52/0235 370/311 |
| 2011/0047430 A1 * | 2/2011 | Feuersanger | ......... | H04L 1/1822 714/748 |
| 2011/0096765 A1 * | 4/2011 | Chappaz | ............. | H03M 13/653 370/342 |
| 2011/0223924 A1 * | 9/2011 | Lohr | ................... | H04L 27/2601 455/450 |
| 2013/0155974 A1 * | 6/2013 | Papasakellariou | .. | H04W 72/042 370/329 |
| 2013/0242842 A1 * | 9/2013 | Wong | .................... | H04L 1/0061 370/312 |
| 2013/0301587 A1 * | 11/2013 | Luo | ....................... | H04W 72/02 370/329 |
| 2016/0249355 A1 * | 8/2016 | Chae | .................... | H04L 5/0091 |
| 2017/0171897 A1 * | 6/2017 | Ryu | ..................... | H04L 5/0044 |
| 2017/0238287 A1 * | 8/2017 | Kusashima | ........... | H04L 1/1854 370/280 |
| 2018/0027441 A1 * | 1/2018 | Kim | .................... | H04W 52/243 370/311 |
| 2018/0317129 A1 * | 11/2018 | Suzuki | .................. | H04W 72/14 |
| 2018/0375623 A1 * | 12/2018 | Suzuki | .................. | H04L 1/1812 |

FOREIGN PATENT DOCUMENTS

| | | | | |
|---|---|---|---|---|
| KR | 20100078134 A | 7/2010 | | |
| WO | 2009/022091 A1 | 2/2009 | | |
| WO | WO-2009022091 A1 * | 2/2009 | .......... | H03M 13/653 |
| WO | 2010/086715 A1 | 8/2010 | | |
| WO | 2014/135090 A1 | 9/2014 | | |

OTHER PUBLICATIONS

International Search Report and Written Opinion received for corresponding Patent Cooperation Treaty Application No. PCT/FI2017/050752, dated Feb. 28, 2018, 14 pages.

European Extended Search Report issued in corresponding European Patent Application No. 17876467.6-1220 dated Jun. 18, 2020.

First Office Action issued in corresponding Chinese Patent Application No. 2017800708500 dated Nov. 26, 2021, with English summary thereof.

\* cited by examiner

RECIPIENT IDENTIFICATION FOR FIFTH GENERATION COMMUNICATION

RELATED APPLICATION

This application was originally filed as PCT Application No. PCT/FI2017/050752 on Oct. 31, 2017, which claims priority of U.S. Provisional Patent Application No. 62/429,219, filed Dec. 2, 2016.

BACKGROUND

Field

Identification of communication participants may be an important aspect of various communication systems. For example, fifth generation (5G) wireless communication systems may benefit from suitable recipient identification.

Description of the Related Art

In certain situations, the intended recipient of a packet may have to be identified, and the receiver may not know the physical resource blocks (PRBs) of the data transmission. An example of this kind of situation is physical downlink control channel (PDCCH) decoding in downlink (DL). In this case a blind decoding may need to be used. In long term evolution (LTE) this identification can be done by masking the cyclic redundancy check (CRC) bits by a user equipment (UE) identifier (UID), such as radio network temporary identifier (RNTI), for example. The overhead from CRC degrades performance.

Thus, CRC masking with UID is used in LTE but deteriorates performance. For low-density parity-check (LDPC), CRC overhead can be reduced with the use of parity check for detection purpose. For example, syndrome check can be done very efficiently with LDPC codes. The parity check normally happens for the code word, whereas CRC error detection can be done considering the information block.

SUMMARY

According to a first embodiment, a method can include obtaining data bits to be communicated to a target device. The method can also include obtaining identification bits corresponding to at least one of sender or receiver of the data bits. The method can further include multiplexing the data bits with the identification bits.

In a variant, the identification bits can be or include a radio network temporary identifier.

In a variant, the identification bits can be or include a common identifier of a plurality of receiving devices.

In a variant, the data bits can be or include downlink control information.

In a variant, the identification bits are used as known bits with channel code shortening.

In a variant, the method can include encoding the multiplexed bits.

In a variant, the method can include removing the identification bits from the encoded bits.

In a variant, the method can include performing rate matching on the encoded data bits.

According to a second embodiment, a method can include receiving encoded data bits. The method can also include inserting logarithmic likelihood ratio values corresponding to identification data bits.

In a variant, the identification bits can be or include a radio network temporary identifier.

In a variant, the data bits can be or include downlink control information.

In a variant, the method can include decoding the combined logarithmic likelihood ratio values and encoded data bits.

In a variant, the method can include removing identification data bits.

In a variant, the method can include rate dematching the encoded data bits prior to inserting the logarithmic likelihood ratio values.

According to third and fourth embodiments, an apparatus can include means for performing the method according to the first and second embodiments respectively, in any of their variants.

According to fifth and sixth embodiments, an apparatus can include at least one processor and at least one memory including computer program code. The at least one memory and the computer program code can be configured to, with the at least one processor, cause the apparatus at least to perform the method according to the first and second embodiments respectively, in any of their variants.

According to seventh and eighth embodiments, a computer program product may encode instructions for performing a process including the method according to the first and second embodiments respectively, in any of their variants.

According to ninth and tenth embodiments, a non-transitory computer readable medium may encode instructions that, when executed in hardware, perform a process including the method according to the first and second embodiments respectively, in any of their variants.

According to eleventh and twelfth embodiments, a system may include at least one apparatus according to the third or fifth embodiments in communication with at least one apparatus according to the fourth or sixth embodiments, respectively in any of their variants.

BRIEF DESCRIPTION OF THE DRAWINGS

For proper understanding of the invention, reference should be made to the accompanying drawings, wherein.

DETAILED DESCRIPTION

Certain embodiments relate to how to identify receiver, transmitter, or both in 5G systems with blind decoding. For example, certain embodiments relate specifically to channel code construction. Certain embodiments of the method can be used, for example, in downlink control information reception, and possibly for machine type communication (MTC)/ultra-reliable low latency communication (URLLC) users.

The bits, such as RNTI, that identify the receiver and/or transmitter can be used as known bits with channel code shortening. The data bits, downlink control information (DCI) for example, can be multiplexed with the known UE id bits.

Insertion coding, also known as zero padding and shortening, is a method in which known bits are multiplexed with information bits, thus decreasing coding rate, where the method is used as a part of rate matching. This approach is described in Beermann et al. "Rate-Compatible LDPC codes using Optimized Dummy Bit Insertion," 8th International Symposium on Wireless Communication Systems (ISWCS), 2011, which is hereby incorporated herein by reference in its entirety. Certain embodiments can apply this or a similar or related technique to combine information bits identifying the receiver and/or transmitter with the information to be transmitted.

Figure 1:
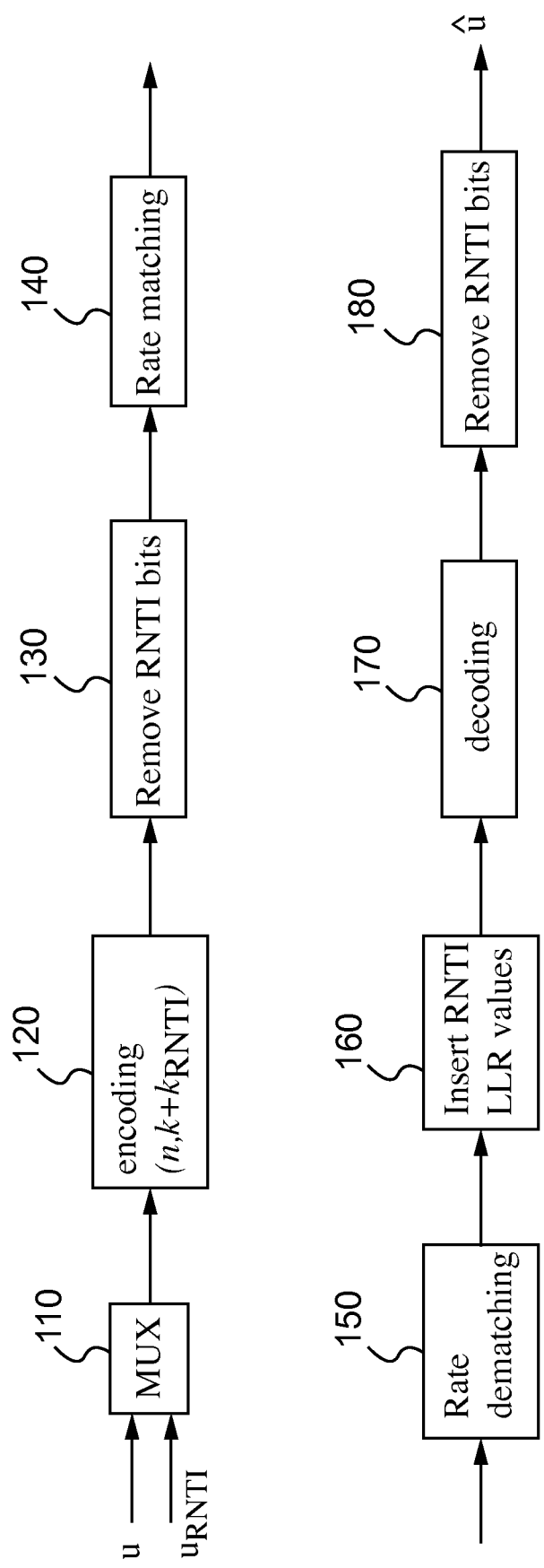
FIG. 1 illustrates an encoding and decoding procedure with RNTI padding, according to certain embodiments.

FIG. 1 illustrates an encoding and decoding procedure with RNTI padding, according to certain embodiments. As shown in FIG. 1, a device can obtain data bits to be communicated to a target device and can obtain identification bits corresponding to at least one of sender or receiver of the data bits. At 110, the device can multiplex the data bits with the identification bits. The identification bits can be or include at least one radio network temporary identifier or any other identifier of a device, such as a user equipment. The data bits can be or include downlink control information or any other data to be sent, for example to be sent to a device that may have to perform blind decoding on the data. The identification bits can be used as known bits with channel code shortening, as mentioned above.

The method can also include, at 120, encoding the multiplexed bits. Moreover, the method can further include, at 130, removing the identification bits from the encoded bits. The method can additionally include, at 140, performing rate matching on the encoded data bits.

The resulting data stream can then be transmitted. At a receiving end of the data stream, the method can include receiving encoded data bits. The method can also include, at 160, inserting logarithmic likelihood ratio values corresponding to identification data bits. The method can include, at 150, rate dematching the encoded data bits prior to inserting the logarithmic likelihood ratio values. The method can also include, at 170, decoding the combined logarithmic likelihood ratio values and encoded data bits. The method can further include, at 180, removing identification data bits.

There are several options. For example, in downlink, the data bits (DCI, for example) and UE id bits can be multiplexed and encoded. If the same data is intended for several receivers (for example, multicast or broadcast), there can be a common id for all of the recipients. The common ID can be communicated to the recipients, for example, with a control channel Both transmitter and intended recipient identifiers can be used. This may be useful for example in massive MTC networks, where data volume per device is very small. When also the recipient ID is used as the known bits in the encoder, the receiver can identify messages which are intended to it.

Multiplexing of two or more users on the same resources can be done in various ways. For example, channel code(s) can be designed to have good performance in interference situations. The users can be separated by their channel codes and IDs. Specific multi-user detection may not be needed but performance can be further improved by multi-user detection (MUD).

LDPC codes inherently require fewer CRC bits. The method of using UE ID bits as shortening bits can be combined with CRC masking. With polar codes, the UE ID bits can replace some of the frozen bits. When systematic polar codes are used, a similar method could be used as in FIG. 1. RNTI bits can be inserted and then punctured prior to the transmission. At the receiver, correct UID can be used to decode the transmitted info block.

Other codes can be applied: repeat and accumulate codes, zigzag codes, turbo product codes, convolutional codes, in fact any systematic code. For non-systematic codes the method can also be applied, but there may be a penalty, since the known bits cannot be punctured.

Certain embodiments can be readily applied to a transmitter. For example, the transmitter can be configured such that CRC appends to the info block, then pads with RNTI sequence. Next, the full block can be encoded and rate matched by removing RNTI bits. Since LDPC is systematic, this operation does not affect decoding if the correct RNTI sequence is used at the receiver side.

Figure 2:
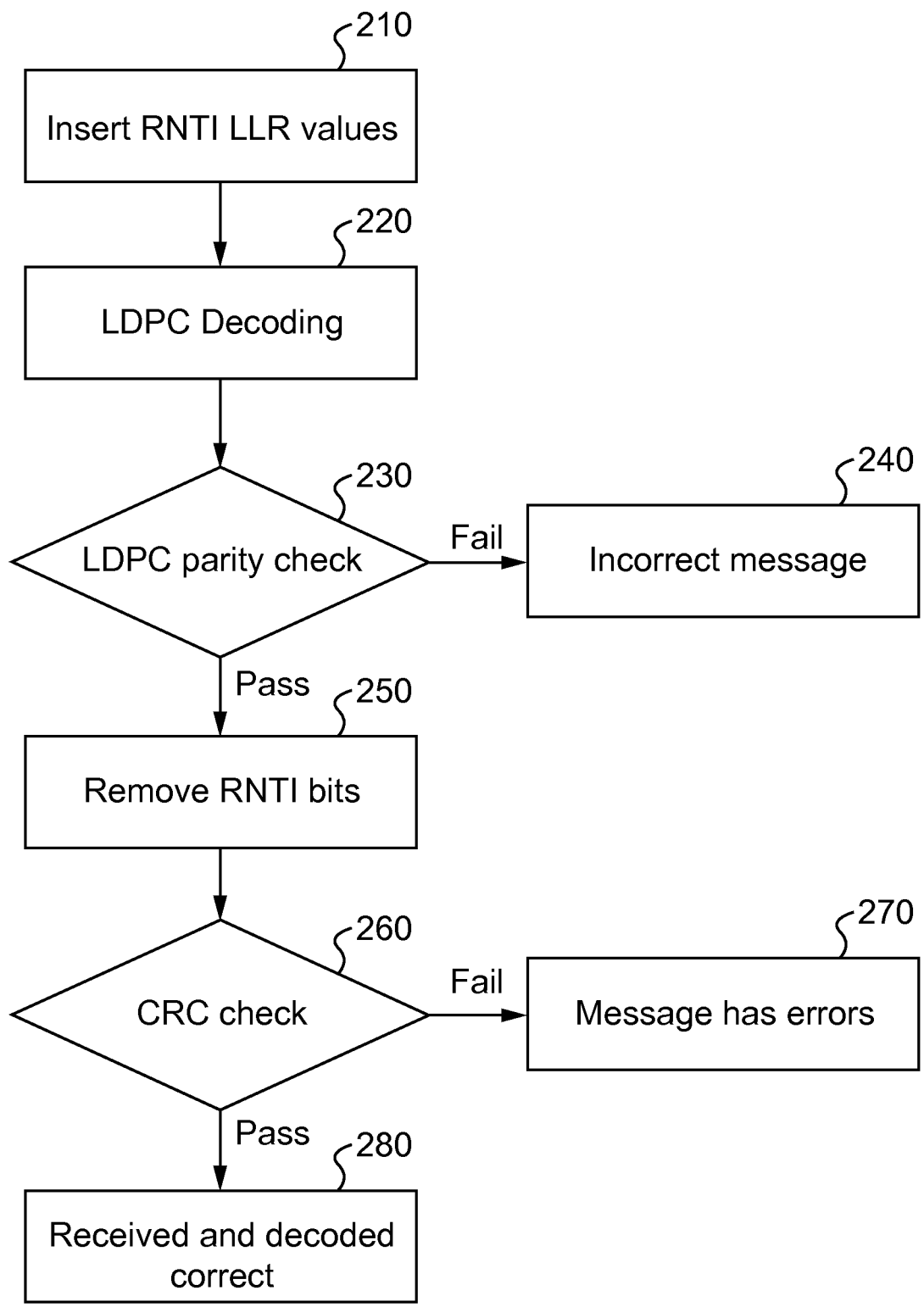
FIG. 2 illustrates a receiver procedure to identify a UE and detect errors, according to certain embodiments.

FIG. 2 illustrates a receiver procedure to identify a UE and detect errors, according to certain embodiments. Thus, FIG. 2 provides in greater detail the decoding procedure that can be performed at a receiving device, such as a UE. The UE can, at 210, append its own RNTI sequence with suitable max/min LLRs prior to decoding at 220. If the parity check at 230 passes, then the UE can move into the next stages of decoding. If the parity check fails, the message can view as incorrect, at 240, meaning that the message may not be intended to go to the UE. Even though the message passes the parity check at 230, it may need to go through CRC check at 260, which can be facilitated by RNTI removal at 250. If the CRC check 260 fails, the UE can conclude, at 270, that the message has errors. Otherwise, the UE can conclude, at 280, that message has been received and correctly decoded. This process can improve error detection false acceptance rate (FAR) at the UE.

Figure 3:
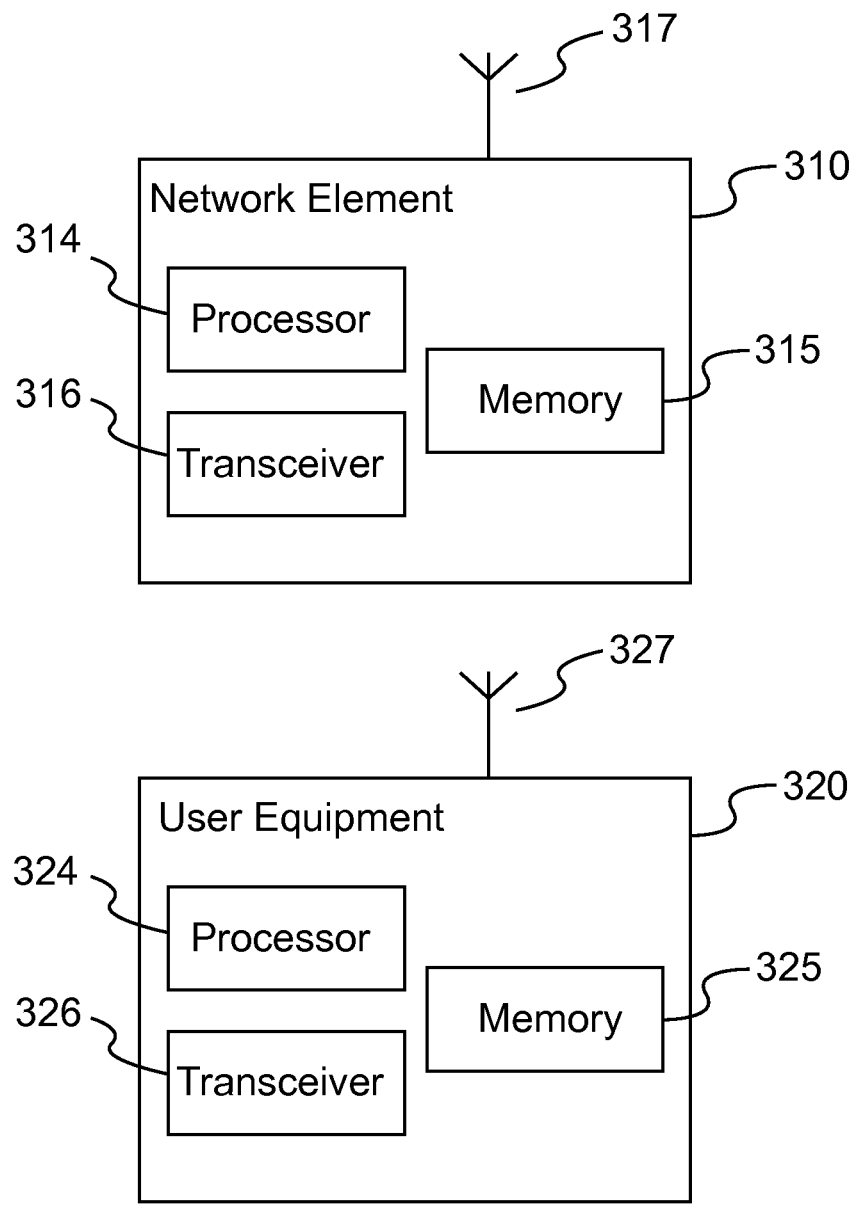
FIG. 3 illustrates a system according to certain embodiments.

FIG. 3 illustrates a system according to certain embodiments of the invention. It should be understood that each block of the flowchart of FIG. 1 may be implemented by various means or their combinations, such as hardware, software, firmware, one or more processors and/or circuitry. In one embodiment, a system may include several devices, such as, for example, network element 310 and user equipment (UE) or user device 320. The system may include more than one UE 320 and more than one network element 310, although only one of each is shown for the purposes of illustration. A network element can be an access point, a base station, an eNode B (eNB), or any other network element. Each of these devices may include at least one processor or control unit or module, respectively indicated as 314 and 324. At least one memory may be provided in each device, and indicated as 315 and 325, respectively. The memory may include computer program instructions or computer code contained therein, for example for carrying out the embodiments described above. One or more transceiver 316 and 326 may be provided, and each device may also include an antenna, respectively illustrated as 317 and 327. Although only one antenna each is shown, many antennas and multiple antenna elements may be provided to each of the devices. Other configurations of these devices, for example, may be provided. For example, network element 310 and UE 320 may be additionally configured for wired communication, in addition to wireless communication, and in such a case antennas 317 and 327 may illustrate any form of communication hardware, without being limited to merely an antenna.

Transceivers 316 and 326 may each, independently, be a transmitter, a receiver, or both a transmitter and a receiver, or a unit or device that may be configured both for transmission and reception. The transmitter and/or receiver (as far as radio parts are concerned) may also be implemented as a remote radio head which is not located in the device itself, but in a mast, for example. It should also be appreciated that according to the "liquid" or flexible radio concept, the operations and functionalities may be performed in different entities, such as nodes, hosts or servers, in a flexible manner. In other words, division of labor may vary case by case. One possible use is to make a network element to deliver local content. One or more functionalities may also be implemented as a virtual application that is provided as software that can run on a server.

A user device or user equipment 320 may be a mobile station (MS) such as a mobile phone or smart phone or multimedia device, a computer, such as a tablet, provided with wireless communication capabilities, personal data or digital assistant (PDA) provided with wireless communication capabilities, vehicle, portable media player, digital camera, pocket video camera, navigation unit provided with wireless communication capabilities or any combinations thereof. The user device or user equipment 320 may be a sensor or smart meter, or other device that may usually be configured for a single location.

In an exemplifying embodiment, an apparatus, such as a node or user device, may include means for carrying out embodiments described above in relation to FIG. 1.

Processors 314 and 324 may be embodied by any computational or data processing device, such as a central processing unit (CPU), digital signal processor (DSP), application specific integrated circuit (ASIC), programmable logic devices (PLDs), field programmable gate arrays (FPGAs), digitally enhanced circuits, or comparable device or a combination thereof. The processors may be implemented as a single controller, or a plurality of controllers or processors. Additionally, the processors may be implemented as a pool of processors in a local configuration, in a cloud configuration, or in a combination thereof. The term circuitry may refer to one or more electric or electronic circuits. The term processor may refer to circuitry, such as logic circuitry, that responds to and processes instructions that drive a computer.

For firmware or software, the implementation may include modules or units of at least one chip set (e.g., procedures, functions, and so on). Memories 315 and 325 may independently be any suitable storage device, such as a non-transitory computer-readable medium. A hard disk drive (HDD), random access memory (RAM), flash memory, or other suitable memory may be used. The memories may be combined on a single integrated circuit as the processor, or may be separate therefrom. Furthermore, the computer program instructions may be stored in the memory and which may be processed by the processors can be any suitable form of computer program code, for example, a compiled or interpreted computer program written in any suitable programming language. The memory or data storage entity is typically internal but may also be external or a combination thereof, such as in the case when additional memory capacity is obtained from a service provider. The memory may be fixed or removable.

The memory and the computer program instructions may be configured, with the processor for the particular device, to cause a hardware apparatus such as network element 310 and/or UE 320, to perform any of the processes described above (see, for example, FIG. 1). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler. Alternatively, certain embodiments of the invention may be performed entirely in hardware.

Furthermore, although FIG. 3 illustrates a system including a network element 310 and a UE 320, embodiments of the invention may be applicable to other configurations, and configurations involving additional elements, as illustrated and discussed herein. For example, multiple user equipment devices and multiple network elements may be present, or other nodes providing similar functionality, such as nodes that combine the functionality of a user equipment and an access point, such as a relay node.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

List of Abbreviations

CRC Cyclic redundancy check
DCI Downlink Control Information
MTC Machine Type Communication
RNTI Radio Network Temporary Identifier
UID User Equipment Identity
URLLC Ultra Reliable and Low Latency Communication

We claim:

1. An apparatus, comprising:
at least one processor; and
at least one memory including computer program code, wherein the at least one memory and the computer program code are configured to, with the at least one processor, cause the apparatus at least to perform:
obtain data bits to be communicated to a target device;
obtain identification bits corresponding to at least one of sender or receiver of the data bits;
multiplex the data bits with the identification bits by insertion coding, wherein the identification bits are used as known bits in the insertion coding; and
encode the multiplexed bits.

2. The apparatus of claim 1, wherein the identification bits comprise a radio network temporary identifier.

3. The apparatus of claim 1, wherein the identification bits comprise a common identifier of a plurality of receiving devices.

4. The apparatus of claim 1, wherein the data bits comprise downlink control information.

5. The apparatus of claim 1, wherein the identification bits are used as known bits with channel code shortening.

6. The apparatus of claim 1, wherein the at least one memory and the computer program code are further configured to, with the at least one processor, cause the apparatus to: remove identification data bits from the encoded bits.

7. The apparatus of claim 1, wherein the at least one memory and the computer program code are further configured to, with the at least one processor, cause the apparatus to: perform rate matching on the encoded data bits.

8. An apparatus, comprising:
at least one processor; and
at least one memory including computer program code, wherein the at least one memory and the computer program code are configured to, with the at least one processor, cause the apparatus at least to perform:

receive encoded data bits; and insert logarithmic likelihood ratio values corresponding to identification data bits into the received encoded data bits.

9. The apparatus of claim 8, wherein identification bits comprise a radio network temporary identifier.

10. The apparatus of claim 8, wherein the data bits comprise downlink control information.

11. The apparatus of claim 8, wherein the at least one memory and the computer program code are further configured to, with the at least one processor, cause the apparatus to: decode the combined logarithmic likelihood ratio values and encoded data bits.

12. The apparatus of claim 11, wherein the at least one memory and the computer program code are further configured to, with the at least one processor, cause the apparatus to: remove the identification data bits.

13. The apparatus of claim 8, wherein the at least one memory and the computer program code are further configured to, with the at least one processor, cause the apparatus to: rate dematch the encoded data bits prior to inserting the logarithmic likelihood ratio values.

14. A method, comprising:

obtaining data bits to be communicated to a target device;

obtaining identification bits corresponding to at least one of sender or receiver of the data bits;

multiplexing the data bits with the identification bits by insertion coding, wherein the identification bits are used as known bits in the insertion coding; and encoding the multiplexed bits.

15. The method of claim 14, wherein the identification bits comprise a radio network temporary identifier.

16. The method of claim 14, wherein the identification bits comprise a common identifier of a plurality of receiving devices.

17. The method of claim 14, wherein the identification bits are used as known bits with channel code shortening.

18. The method of claim 14, further comprising: removing identification data bits from the encoded bits.

* * * * *